US012686940B2

(12) United States Patent
Takano et al.

(10) Patent No.: US 12,686,940 B2
(45) Date of Patent: Jul. 21, 2026

(54) SINGLE CRYSTAL PULLING APPARATUS AND METHOD FOR PULLING SINGLE CRYSTAL

(71) Applicant: SHIN-ETSU HANDOTAI CO., LTD., Tokyo (JP)

(72) Inventors: Kiyotaka Takano, Annaka (JP); Hiroyuki Kamada, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 238 days.

(21) Appl. No.: 18/281,176

(22) PCT Filed: Jan. 28, 2022

(86) PCT No.: PCT/JP2022/003324
§ 371 (c)(1),
(2) Date: Sep. 8, 2023

(87) PCT Pub. No.: WO2022/196127
PCT Pub. Date: Sep. 22, 2022

(65) Prior Publication Data
US 2024/0141548 A1 May 2, 2024

(30) Foreign Application Priority Data
Mar. 15, 2021 (JP) ................................ 2021-041331

(51) Int. Cl.
| | |
|---|---|
| *C30B 15/20* | (2006.01) |
| *C30B 29/06* | (2006.01) |
| *C30B 30/04* | (2006.01) |

(52) U.S. Cl.
CPC .............. *C30B 15/20* (2013.01); *C30B 29/06* (2013.01); *C30B 30/04* (2013.01)

(58) Field of Classification Search
CPC ......... C30B 15/20; C30B 29/06; C30B 30/04; Y10T 117/1032
See application file for complete search history.

(56) References Cited

U.S. PATENT DOCUMENTS

| | | |
|---|---|---|
| 6,019,837 A | 2/2000 | Maeda et al. |
| 8,147,611 B2 | 4/2012 | Sakurada et al. |
| | (Continued) | |

FOREIGN PATENT DOCUMENTS

| | | |
|---|---|---|
| DE | 10324674 A1 | 1/2004 |
| DE | 112017002662 T5 | 3/2019 |
| | (Continued) | |

OTHER PUBLICATIONS

Notification of Reasons for Refusal mailed Mar. 26, 2024, in Japanese Application No. 2021-041331.
(Continued)

*Primary Examiner* — Robert M Kunemund
(74) *Attorney, Agent, or Firm* — Harness, Dickey & Pierce, P.L.C.

(57) ABSTRACT

The present invention is a single crystal pulling apparatus which includes a pulling furnace having a central axis and a magnetic field generating apparatus having coils, and applies a horizontal magnetic field to a molten semiconductor raw material, wherein the coils are saddle-shaped, two pairs of the coils are provided with the coils of each pair arranged facing each other, two coil axes in the two pairs of coils are included in the same horizontal plane, when a magnetic force line direction on the central axis of the pulling furnace in the horizontal plane is defined as a X-axis, and a direction perpendicular to the X-axis in the horizontal plane is defined as a Y-axis, a center angle α between the two coil axes sandwiching the X-axis is 90 degrees or less and an inter-coil angle β between adjacent superconducting coils sandwiching the Y-axis is 20 degrees or less. As a result, the
(Continued)

coil height can be reduced by increasing the magnetic field generation efficiency, the magnetic field center can be raised to near the melt surface of the semiconductor raw material, and it is possible to provide a single crystal pulling apparatus and a single crystal pulling method capable of pulling a single crystal with an even lower oxygen concentration than before and a defect-free crystal at a higher speed can be obtained.

15 Claims, 12 Drawing Sheets

(56) References Cited

U.S. PATENT DOCUMENTS

| | | | |
|---|---|---|---|
| 2004/0107894 A1 | 6/2004 | Shimonosono et al. | |
| 2010/0101485 A1* | 4/2010 | Fu | C30B 29/06 |
| | | | 117/32 |
| 2010/0126409 A1 | 5/2010 | Sakurada et al. | |
| 2011/0077161 A1 | 3/2011 | Takami et al. | |
| 2018/0237940 A1 | 8/2018 | Takano | |
| 2019/0161866 A1 | 5/2019 | Kubota et al. | |
| 2020/0165742 A1 | 5/2020 | Sugimura et al. | |
| 2023/0175166 A1 | 6/2023 | Takano et al. | |

FOREIGN PATENT DOCUMENTS

| | | | | |
|---|---|---|---|---|
| JP | H08-333190 A | | 12/1996 | |
| JP | H10-291892 A | | 11/1998 | |
| JP | 2000007485 A | * | 1/2000 | |
| JP | 2001-302392 A | | 10/2001 | |
| JP | 2003-063891 A | | 3/2003 | |
| JP | 2004-051475 A | | 2/2004 | |
| JP | 2004182560 A | * | 7/2004 | |
| JP | 2004315289 A | * | 11/2004 | C30B 15/305 |
| JP | 2007-007456 A | | 1/2007 | |
| JP | 2007-184383 A | | 7/2007 | |
| JP | 2009-249232 A | | 10/2009 | |
| JP | 2009256206 A | * | 11/2009 | |
| JP | 2010-006687 A | | 1/2010 | |
| JP | 2010-100474 A | | 5/2010 | |
| JP | 2017-057127 A | | 3/2017 | |
| JP | 2017-206396 A | | 11/2017 | |
| JP | 2020-183334 A | | 11/2020 | |
| TW | 201534773 A | | 9/2015 | |
| WO | 2007007456 A1 | | 1/2007 | |

OTHER PUBLICATIONS

German Office Action in application No. 11 2022 000 585.8 issued on Apr. 17, 2025.

International Search Report of the ISA issued in PCT/JP2022/003324, mailed Mar. 22, 2022; ISA/JP.

International Preliminary Report on Patentability for International Application No. PCT/JP2022/003324, mailed Sep. 12, 2023.

Korean Office Action in application No. 2023-7030910 issued on Sep. 16, 2025.

Taiwanese Office Action in application No. 111104831 issued on Oct. 3, 2025.

Chinese Office Action in application No. 202280019090.1 issued on May 21, 2026.

* cited by examiner

[FIG. 1]
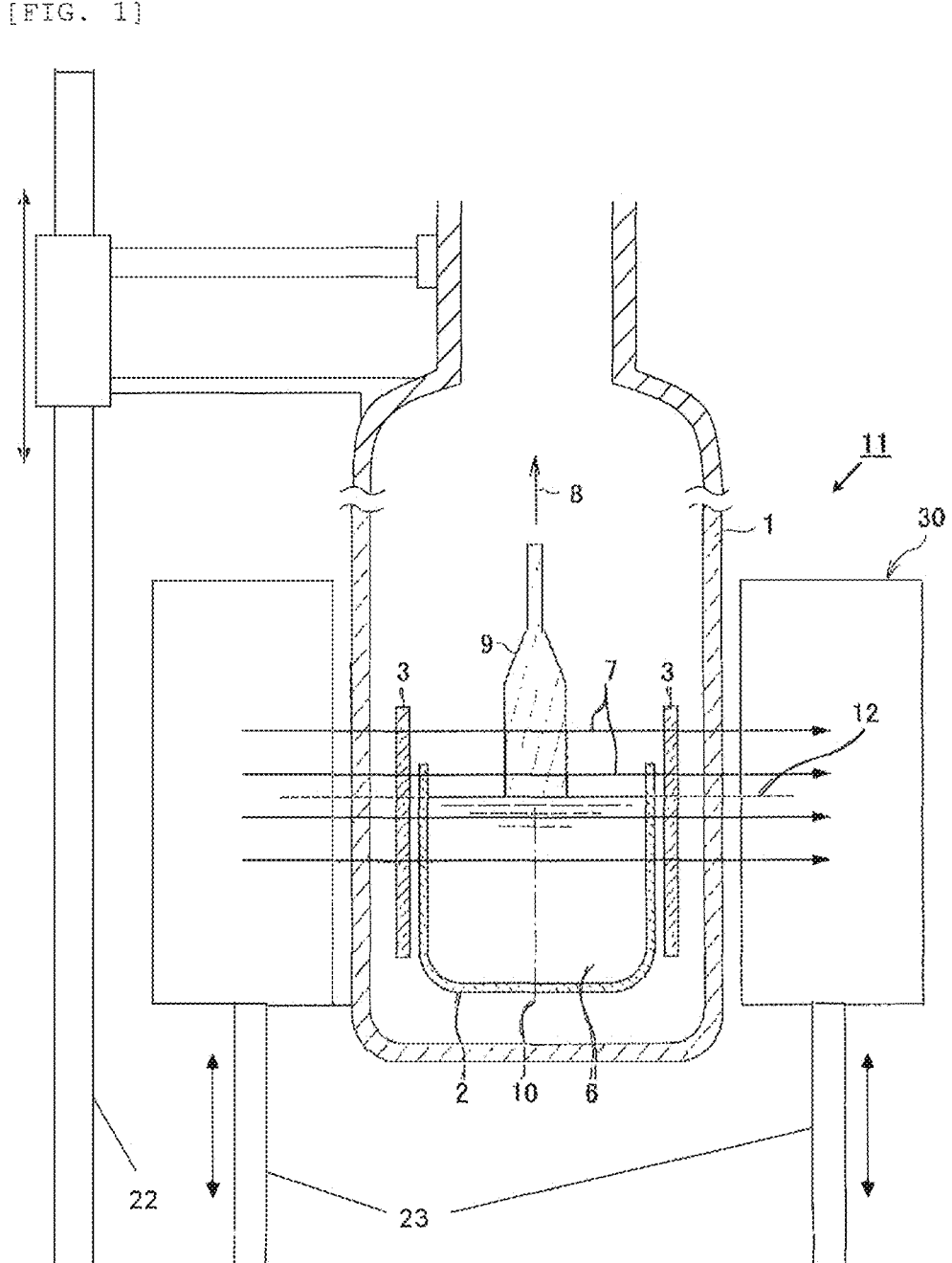

[FIG. 2A]
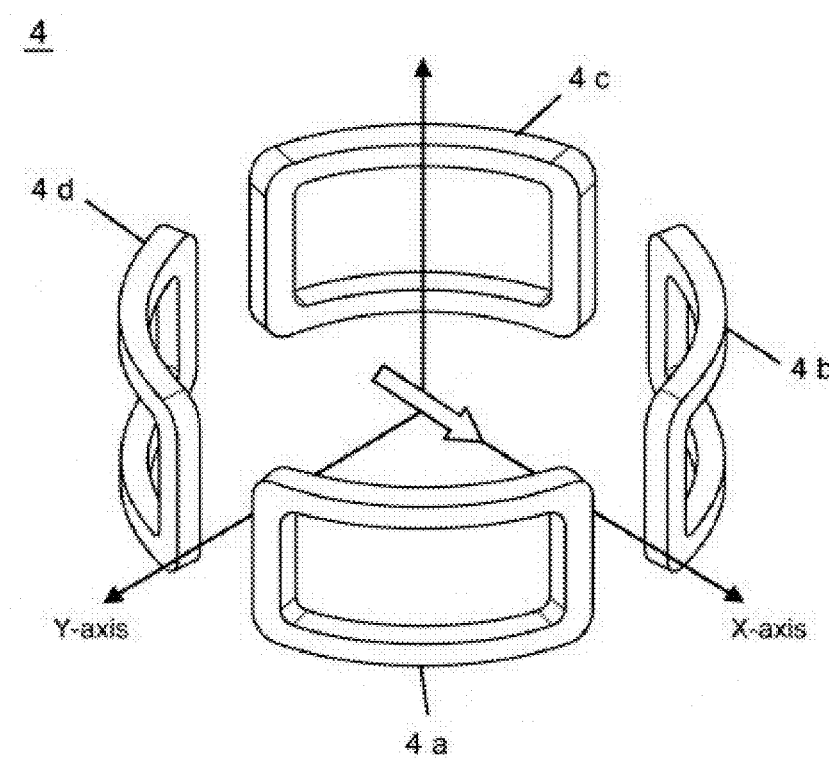
[FIG. 2B]
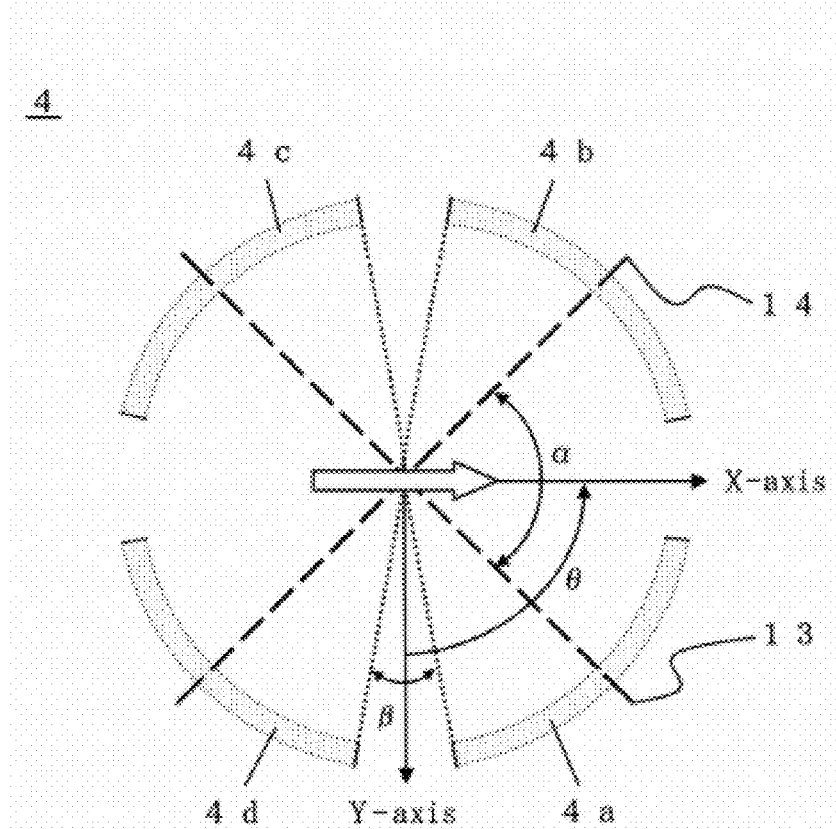

[FIG. 3]
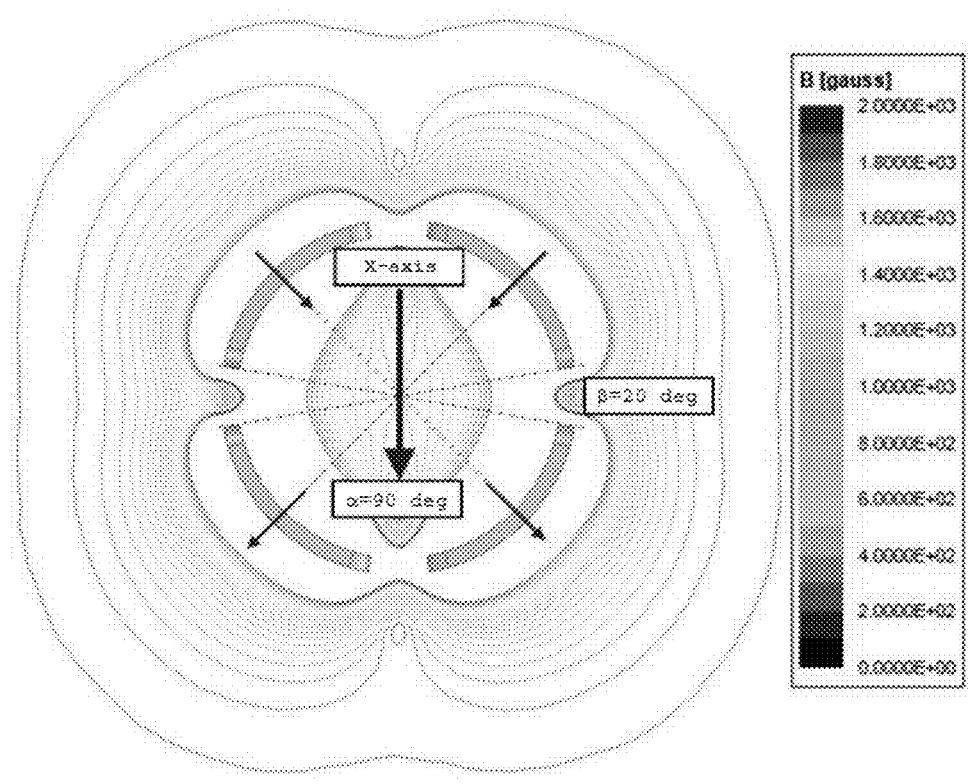
[FIG. 4]
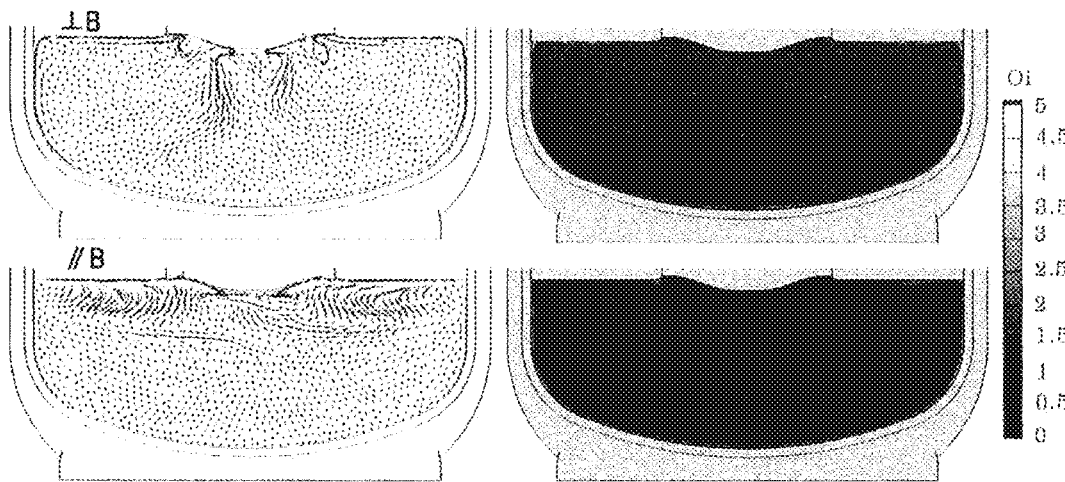

[FIG. 5]
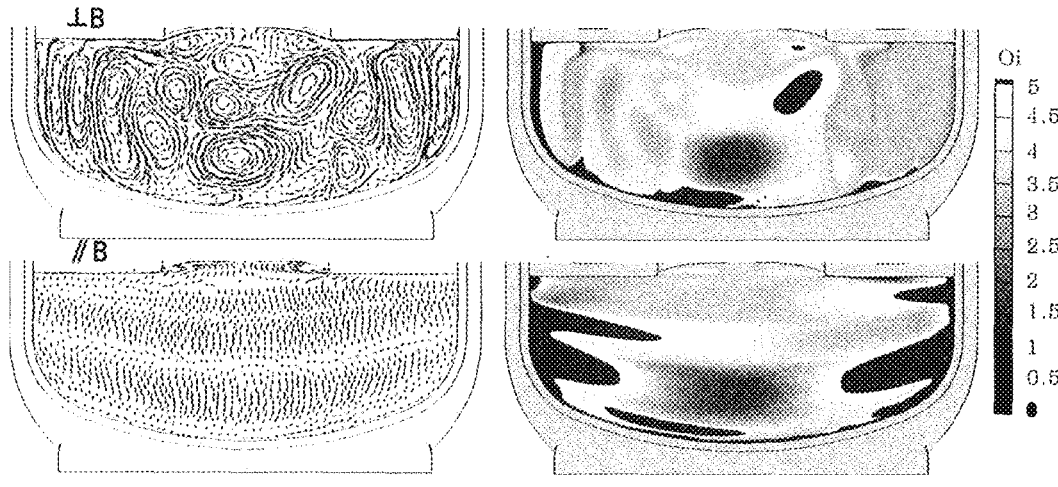
[FIG. 6]
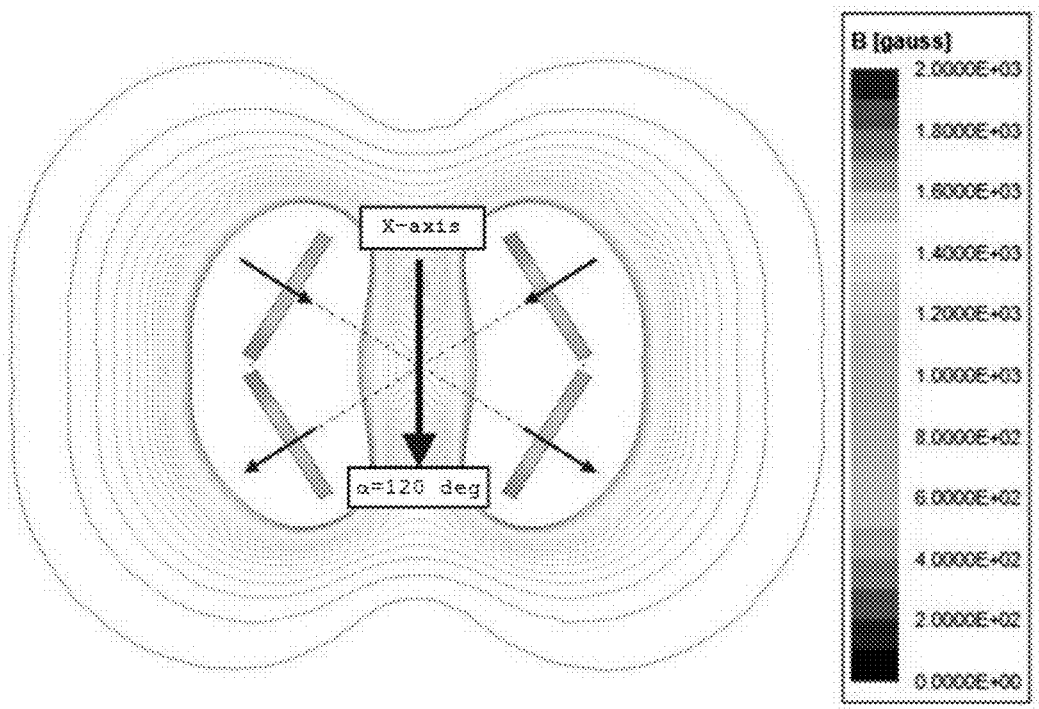

[FIG. 7]
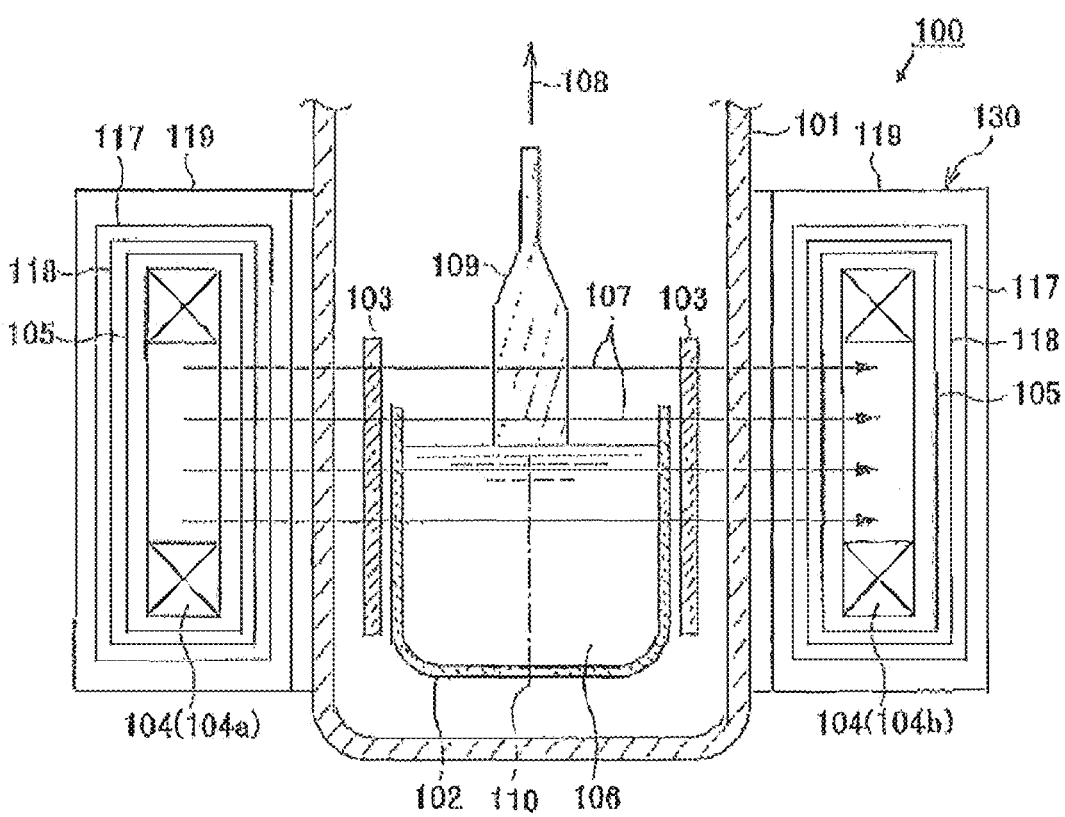
[FIG. 8]

[FIG. 9]
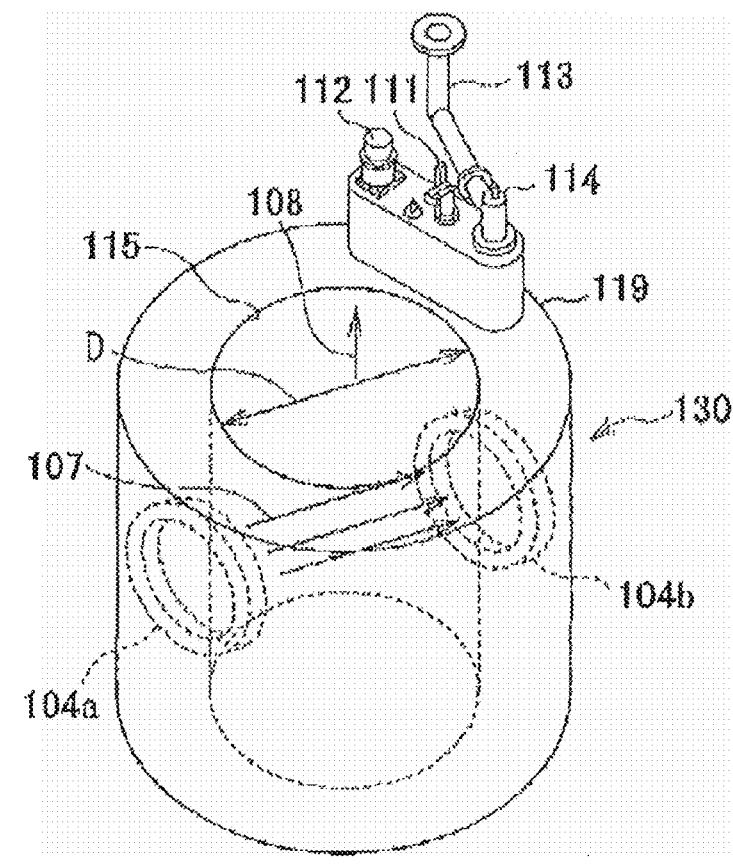
[FIG. 10]
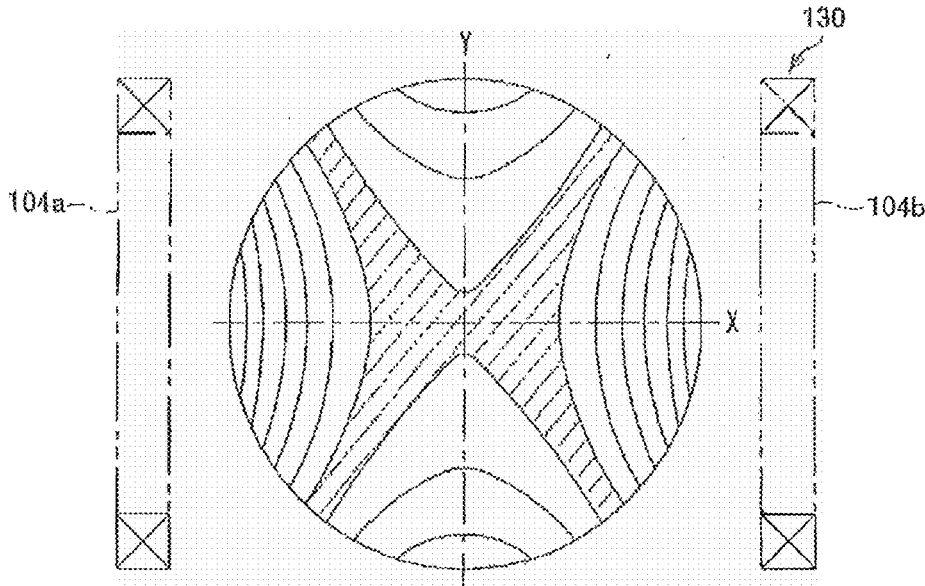

[FIG. 11A]
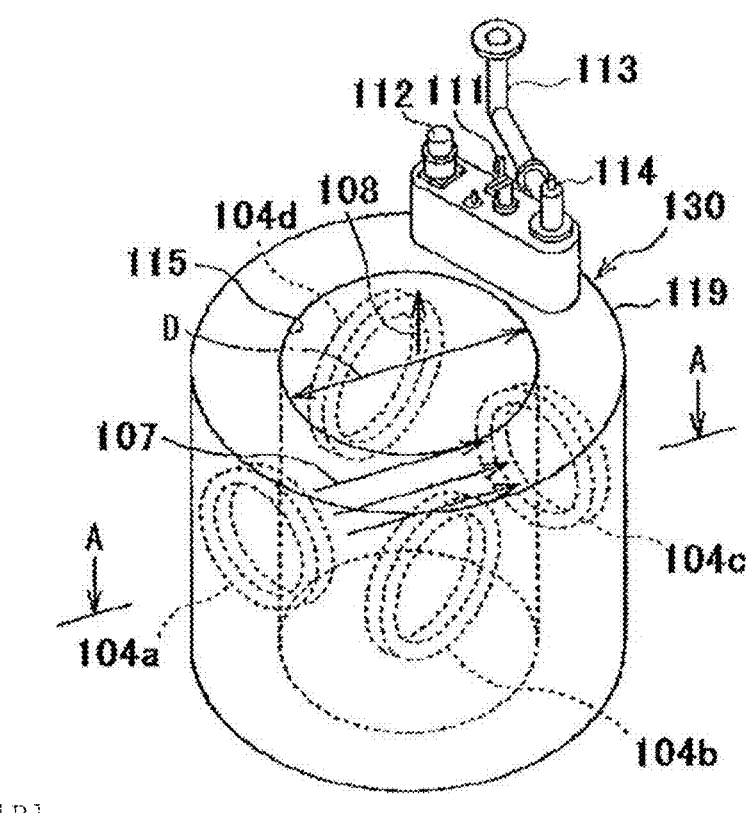
[FIG. 11B]
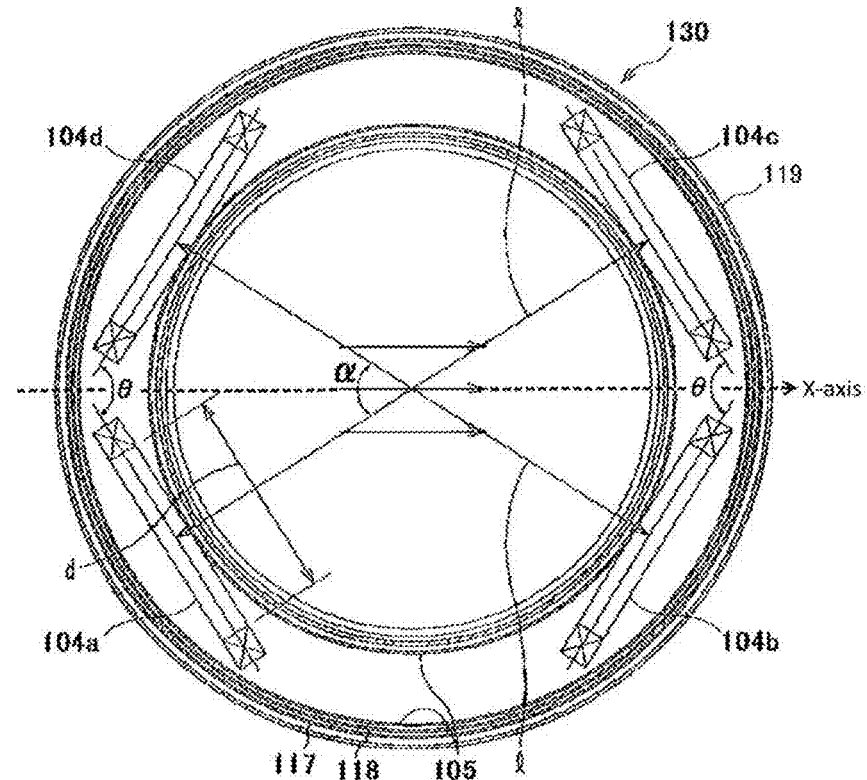

[FIG. 12A]
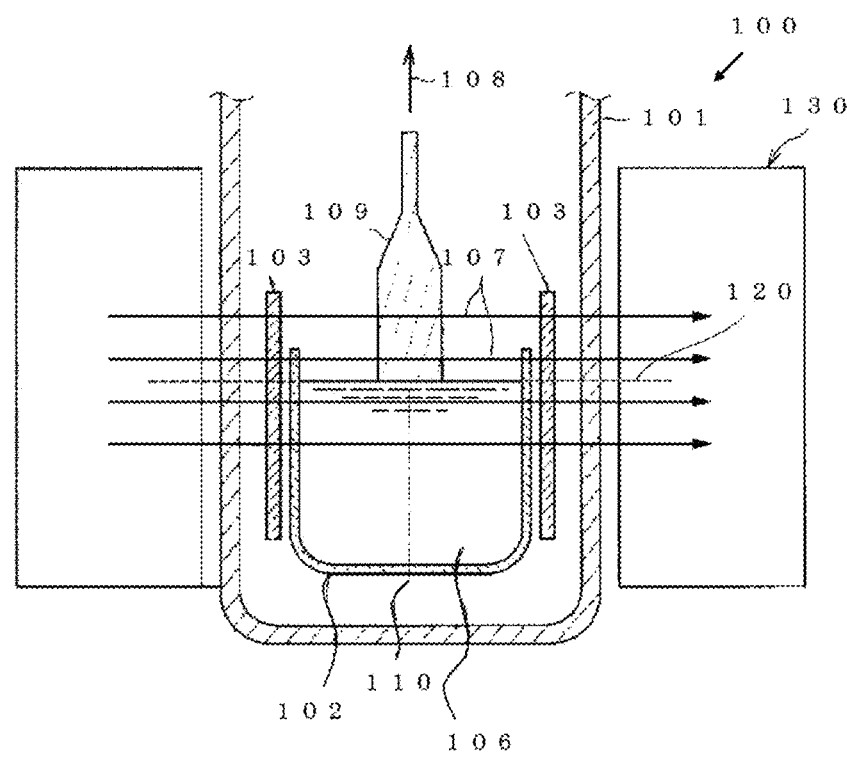
[FIG. 12B]
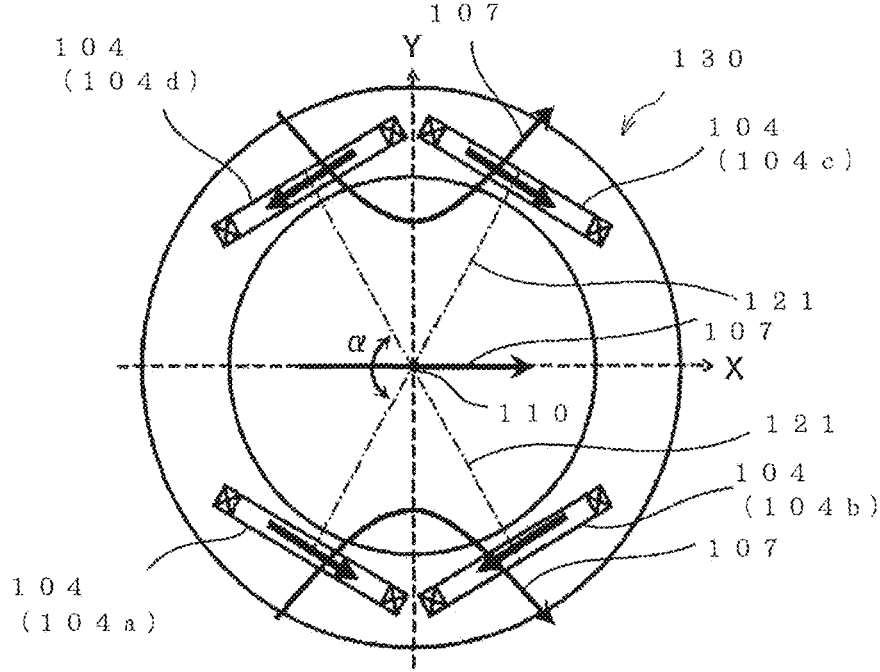

[FIG. 13]
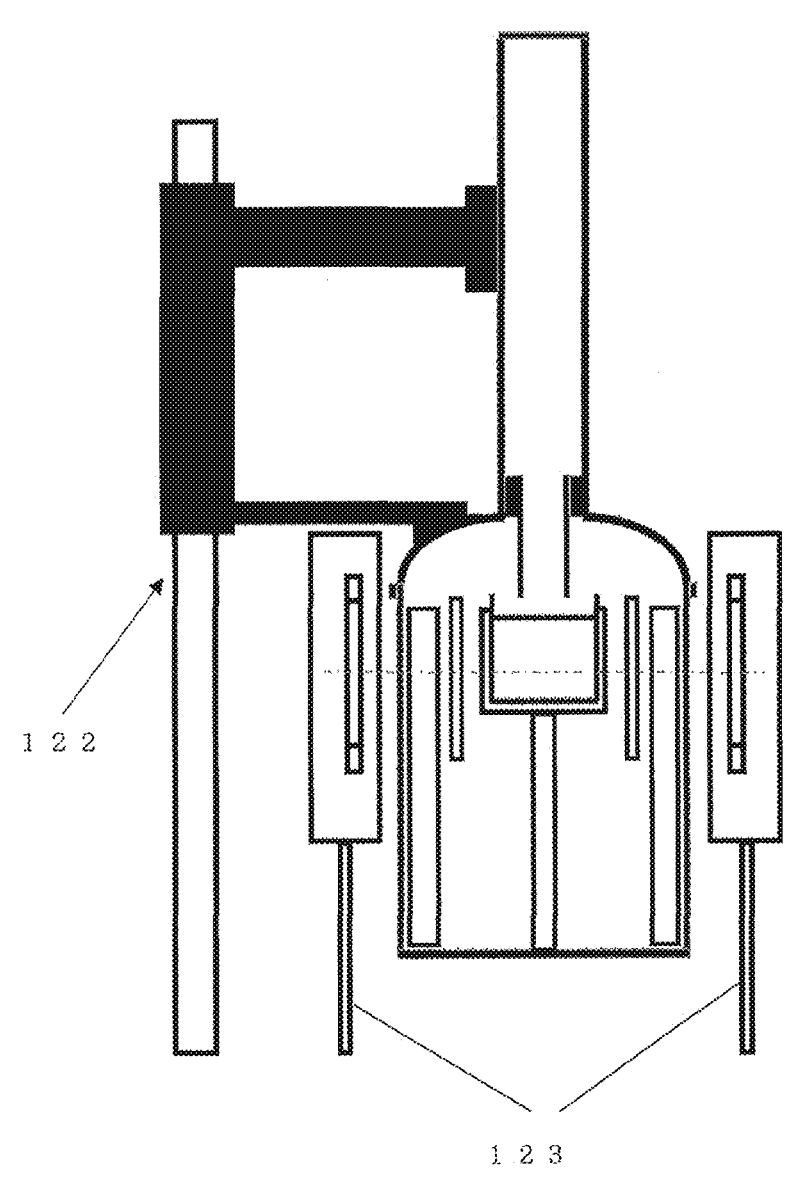
1 2 2
1 2 3

[FIG. 14]
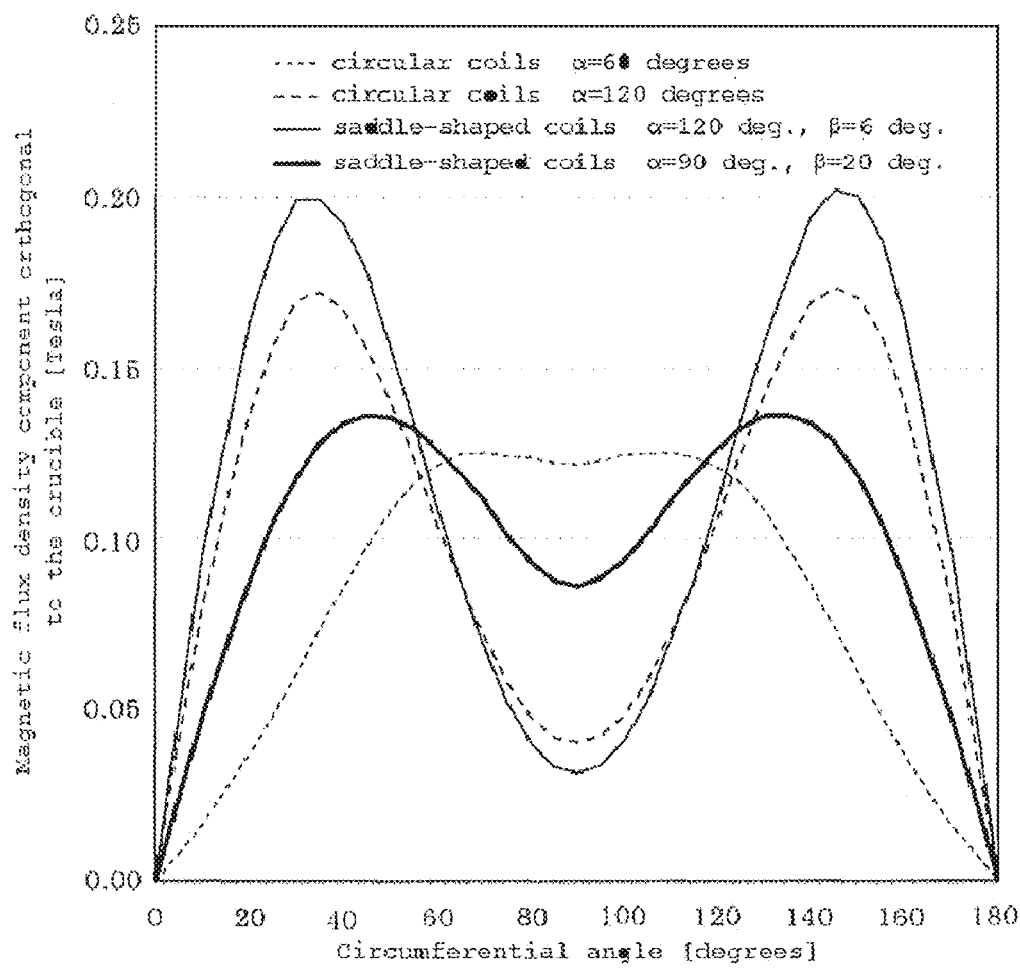

[FIG. 15]
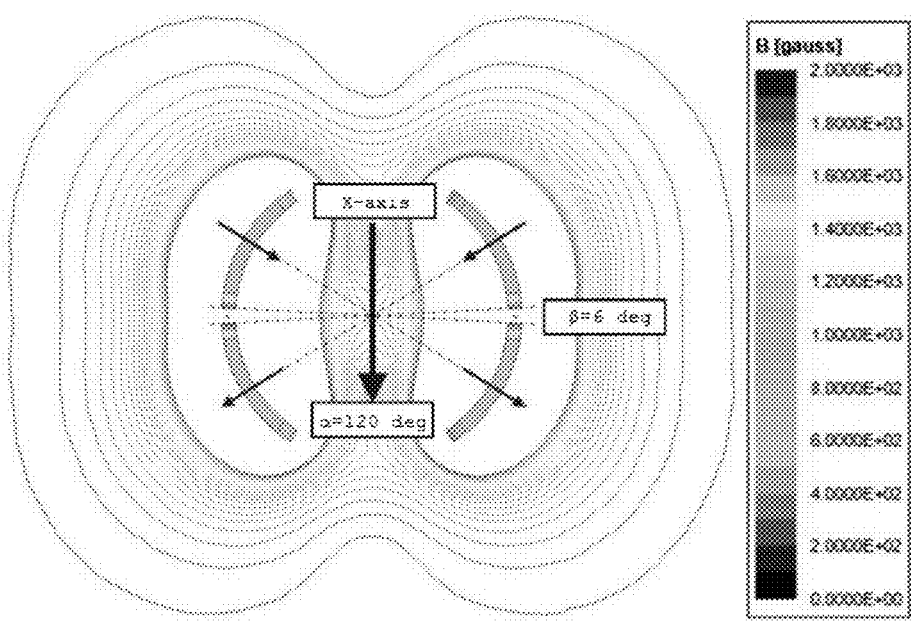
[FIG. 16]
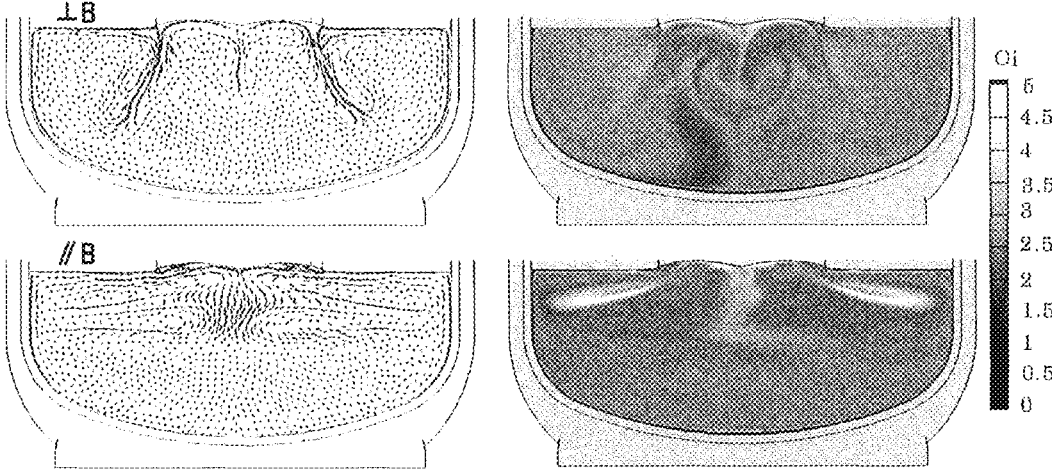

[FIG. 17]
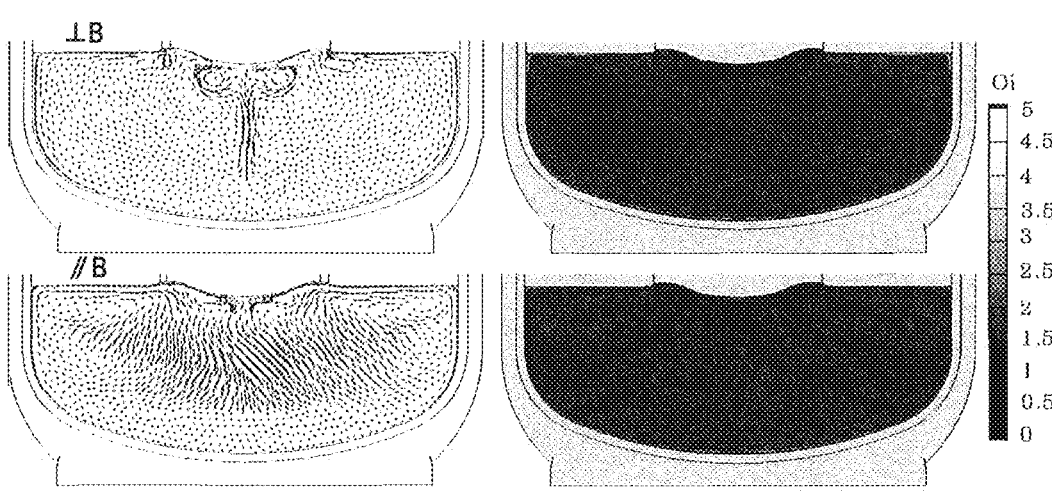

SINGLE CRYSTAL PULLING APPARATUS AND METHOD FOR PULLING SINGLE CRYSTAL

CROSS-REFERENCE TO RELATED APPLICATIONS

This application is a 371 U.S. National Phase of International Application No. PCT/JP2022/003324, filed Jan. 28, 2022, which claims priority to Japanese Application No. 2021-041331, filed Mar. 15, 2021. The entire disclosures of the above applications are incorporated herein by reference.

TECHNICAL FIELD

The present invention relates to a single crystal pulling apparatus and a method for pulling a single crystal using the same.

BACKGROUND ART

Semiconductors such as silicon and gallium arsenide are composed of single crystals and are used for memory devices or the like of small to large computers, and there is a demand for large-capacity, low-cost, and high-quality storage devices.

Conventionally, as one method of pulling a single crystal for producing a single crystal that satisfies these semiconductor requirements, a method (generally referred to as the magnetic field applied Czochralski (MCZ) method) in which a magnetic field is applied to a molten semiconductor raw material contained in a crucible, thereby suppressing thermal convection generating in the melt to produce large-diameter and high-quality semiconductors is known.

An example of a conventional single crystal pulling apparatus using the CZ method will be described with reference to FIG. 8.

This single crystal pulling apparatus 100 has a pulling furnace 101 with an open on an upper surface, and a crucible 102 is incorporated in the pulling furnace 101. Inside the pulling furnace 101, a heater 103 for heating and melting the semiconductor raw material 106 in the crucible 102 is provided around the crucible 102. Outside the pulling furnace 101, a superconducting magnet 130 is provided with a pair (two) of superconducting coils 104 (104a, 104b) being arranged in a refrigerant container (hereinafter also referred to as a cylindrical refrigerant container) 105 as a cylindrical container.

In producing a single crystal, semiconductor raw material 106 is placed in the crucible 102 and heated by the heater 103 to melt semiconductor raw material 106. A seed crystal (not shown) descends from above the center of the crucible 102 into the melt and contacts it, and is pulled in a pulling direction 108 at a predetermined speed by a pulling mechanism (not shown). As a result, the crystal grows in the solid/liquid interface layer to produce a single crystal. At this time, if fluid motion of the melt induced by the heating of the heater 103, that is, thermal convection occurs, the single crystal to be pulled tends to have dislocations, and the yield of single crystal production decreases.

Therefore, as a countermeasure, the superconducting coils 104 of the superconducting magnet 130 are used. That is, the semiconductor raw material 106 as the molten liquid is subjected to an movement suppression force by the magnetic force lines 107 generated by the energization of the superconducting coils 104, and without convection in the crucible 102, the semiconductor raw material 106 slowly moves upward as the seed crystal is pulled. It is pulled and becomes produced as a solid single crystal 109. A pulling mechanism (not shown) is provided above the pulling furnace 101 for pulling the single crystal 109 along the crucible centerline (the central axis 110 of the pulling furnace 101).

Next, an example of the superconducting magnet 130 used in the single crystal pulling apparatus 100 shown in FIG. 8 will be described with reference to FIG. 9.

This superconducting magnet 130 is constructed by housing superconducting coils 104 (104a, 104b) in a cylindrical vacuum container 119 via a cylindrical refrigerant container. In this superconducting magnet 130, a pair of superconducting coils 104a and 104b facing each other through the central portion in a cylindrical vacuum container 119 are accommodated. These superconducting coils 104a and 104b in a pair are Helmholtz type magnetic field coils that generate magnetic fields in the same horizontal direction and a symmetrical magnetic force line 107 is generated to a central axis 110 of the pulling furnace and the cylindrical vacuum container 119 (the position of this central axis 110 is called the magnetic field center).

The superconducting magnet 130 is provided, as shown in FIGS. 8 and 9, with a current lead 111 for introducing a current to the two superconducting coils 104a and 104b, a small helium refrigerator 112 for cooling a first radiation shield 117 housed and a second radiation shield 118 inside a cylindrical vacuum container 119, a gas discharge pipe 113 for discharging the helium gas in the cylindrical refrigerant container 105, and a service port 114 having a supply port for supplying liquid helium. Inside the bore 115 of the superconducting magnet 130 (the inner diameter of the bore is represented by D), the pulling furnace 101 shown in FIG. 8 is arranged.

FIG. 10 shows a magnetic field distribution of the conventional superconducting magnet 130 described above.

As shown in FIG. 10, in the conventional superconducting magnet 130, a pair of superconducting coils 104a and 104b facing each other is arranged so that the magnetic field gradually increases toward the both sides in the direction of arrangement of each coil (the X direction in FIG. 10), and in a direction (Y direction in FIG. 10) perpendicular to the X direction, the magnetic field gradually decreases in the vertical direction. In such a conventional configuration, as shown in FIGS. 9 and 10, the magnetic field gradient within the bore 115 is too large, so that suppression of the thermal convection generated in the melt is unbalanced and the magnetic field efficiency is poor. That is, as indicated by diagonal lines in FIG. 10, since the magnetic field uniformity is not good in the region near the magnetic field center (that is, in FIG. 10, it has a long and narrow cross shape on the top and bottom and left and right), there has been a problem that the suppression accuracy of thermal convection has been poor and a high-quality single crystal has not been pulled.

Patent Document 1 discloses a technique for solving the above problems. The technique disclosed in Patent Document 1 will be described with reference to FIGS. 11A and 11B.

Another example of a superconducting magnet is shown, FIG. 11A is a perspective view, and FIG. 11B shows a cross section taken along line A-A of FIG. 11A. In Patent Document 1, in order to solve the above problem, as shown in FIGS. 11A and 11B, there is disclosed that number of the superconducting coils 104 is set to 4 or more (for example, 4 of 104a, 104b, 104c, 104d) and the centers of the superconducting coils 104 are arranged on a plane inside a cylindrical vacuum container 119 coaxially provided around the pulling furnace. And each of superconducting coils 104 thus arranged is arranged facing each other through the axial center of the cylindrical vacuum container 119, the arrangement angle θ (see FIG. 11B) at which adjacent pairs of superconducting coils face toward the inner side of the cylindrical vacuum container 119 is set in a range of 100° to 130° (that is, the center angle α (see FIG. 11B) between adjacent coil axes sandwiching the X-axis is set to 50° to 80°).

As a result, a horizontal magnetic field with a small magnetic field gradient and good uniformity can be generated inside the bore 115, and a concentric or square magnetic field distribution can be generated on a plane, and the unbalanced electromagnetic force can be greatly suppressed. As a result, it is also disclosed that the uniform magnetic field region in the pulling direction can be improved, the magnetic field in the horizontal magnetic field direction becomes almost horizontal, the unbalanced electromagnetic force can be suppressed, it is therefore enabled to produce a high-quality single crystal, and the high-quality single crystal can be pulled with a high yield according to the crystal pulling method. Note that reference sign d in FIG. 11B is the diameter (inner diameter) of a superconducting coil, and reference sign 1 is the distance between a pair of coils.

According to this method, the magnetic field distribution applied to the molten semiconductor raw material is made uniform and the unbalanced electromagnetic force is suppressed, so compared to the conventional technology using two coils, the thermal convection is suppressed even at a lower magnetic flux density.

However, even with such a uniform magnetic field distribution, in a horizontal magnetic field in which the magnetic force lines are oriented in the X-axis direction, there is a difference in thermal convection between the cross-section parallel to the X-axis and the cross-section parallel to the Y-axis. It was clarified by comprehensive heat transfer analysis including three-dimensional melt convection (see Patent Document 2).

When a conductive fluid moves in a magnetic field, an induced current is generated in the direction perpendicular to the magnetic force line and the velocity component perpendicular to the magnetic force line. When a quartz crucible that has electrical insulation property is used, since a crucible wall and a free surface of the semiconductor raw material serve as an insulating wall, the induced current in the direction orthogonal to them does not flow. For this reason, the convection suppression force due to the electromagnetic force is weak in the upper part of the molten semiconductor raw material, and comparing the cross section parallel to the X-axis (cross section parallel to the magnetic force line) and the cross section perpendicular to the X-axis (cross section perpendicular to the magnetic force line), the cross section perpendicular to the X-axis (the cross section perpendicular to the magnetic force line) has stronger convection.

In this way, when the magnetic field distribution is made uniform by the four coils, the speed difference of the convection is somewhat reduced, but the flow speed distribution is still non-uniform in the circumferential direction. In particular, since the flow field connecting the crucible wall and the growth interface remains in the cross section perpendicular to the magnetic force lines, the oxygen eluted from the quartz crucible reaches the crystal and there is a limit of oxygen concentration lowering effect by magnetic field application. It is difficult to meet the requirement for ultra-low oxygen concentration, such as semiconductor crystals for power devices and image sensors, which have recently been in highly demand. In addition, the existence of a non-uniform flow field in the circumferential direction causes growth striations in a crystal that is pulled while rotating the crystal. Resistivity and oxygen concentration fluctuations due to crystal rotation frequency are observed when evaluating a cross section parallel to the growth direction, resulting in a ring-shaped distribution within the wafer plane sliced perpendicular to the growth direction.

To solve this problem, Patent Document 2 discloses a single crystal pulling apparatus as shown in FIGS. 12A and 12B. FIG. 12A is a schematic diagram of the apparatus, and FIG. 12B shows a cross section showing an example of a superconducting magnet.

Magnetic field distribution is generated so that in a horizontal plane 120 containing two coil axes 121 passing through the centers of pairs of superconducting coils 104 (104*a* and 104*c*, 104*b* and 104*d*), When the direction of the magnetic force line 107 on the central axis 110 of the pulling furnace is defined the X-axis, the magnetic flux density distribution on the X-axis is an upwardly convex distribution, and when the magnetic flux density at the central axis 110 in the horizontal plane 120 is set as the magnetic flux density setting value, the magnetic flux density on the X-axis at the crucible wall is 80% or less of the magnetic flux density setting value, and also the magnetic flux density distribution on the Y-axis perpendicular to the X-axis and passing through the central axis 110 in the horizontal plane 120 is a downward convex distribution, and the magnetic flux density on the Y-axis at the crucible wall is 140% or more of the magnetic flux density setting value. In the magnetic field generating apparatus, two pairs of superconducting coils 104 (104*a* and 104*c*, 104*b* and 104*d*), in which the superconducting coils of each pair face each other, are provided so that the coil axes 121 are included in the same horizontal plane 120, and a center angle α between the two coil axes 121 sandwiching the X-axis set to 100 degrees or more and 120 degrees or less.

As a result, the technique disclosed in Patent Document 2 can obtain the following effects. That is, even in the cross section perpendicular to the X-axis where the electromagnetic-force-based convection suppression force is insufficient, the flow velocity of the molten semiconductor raw material can be reduced, and it is possible to balance the flow velocity in the cross section parallel to the X-axis of the molten semiconductor raw material and the flow velocity in the cross section perpendicular to the X-axis of the molten semiconductor raw material.

Also, in the cross section perpendicular to the X-axis, by reducing the flow velocity of the molten semiconductor raw material, the time required for oxygen eluted from the crucible wall to reach the single crystal becomes longer, and by increasing the amount of oxygen evaporated from the free surface of the molten semiconductor raw material, it is possible to provide a single crystal pulling apparatus capable of greatly reducing the concentration of oxygen taken into the single crystal. In addition, by balancing the flow velocity in a cross section parallel to the X-axis of the molten semiconductor raw material and the flow velocity in a cross section perpendicular to the X-axis of the molten semiconductor raw material, it can be a single crystal pulling apparatus that can suppress growth striations in the growing single crystal.

CITATION LIST

Patent Literature

Patent Document 1: JP 2004-51475 A
Patent Document 2: JP 2017-57127 A

Patent Document 3: JP H10-291892 A
Patent Document 4: JP 2003-63891 A

SUMMARY OF INVENTION

Technical Problem

However, as a result of analysis of the magnetic field distribution in various coil arrangements by the inventors of the present invention, it has been made clear that the magnetic field distribution that produces the same effect as in Patent Document 2 can be realized with a coil arrangement other than that described in Patent Document 2.

In addition, in order to increase the magnetic field efficiency in the above coil arrangement, it is necessary to increase diameter of the coils as much as possible, and accordingly, height of the container containing the coils is also required. In the case of a magnet apparatus (also known as a magnetic field generating apparatus or a superconducting magnet) in a cylindrical container, it is necessary to disassemble and set it after the crystal pulling is finished, and at that time, it is necessary to lower and raise the magnet apparatus. Therefore, the magnet apparatus must be installed on an elevating device.

In addition, the magnetic field generation efficiency of the magnet described in Patent Document 2 is lower than the coil arrangement of Patent Document 1, which is listed as a comparative example of Patent Document 2, so there is also the problem that the magnetic flux density at the center becomes small. In order to pull a defect-free region crystal by the CZ method, although it is necessary that the temperature gradient in the vertical direction is approximately the same over the entire crystal growth interface (hereinafter simply referred to as the growth interface), it requires a growth interface with an upward convex shape in a CZ crystal in which circumferential portion of the crystal tends to be cooled. However, when the magnetic flux density at the center is small, the temperature boundary layer directly under the rotating crystal becomes thick, so that the heat inflow from the melt is reduced, and there is a problem that the growth interface is difficult to be convex upward.

Regarding the positional relationship between the magnet and the molten raw material, as described in Patent Document 3, it is known that when the height of the magnetic field center of the horizontal magnetic field is raised to near the melt surface of the molten raw material, the oxygen concentration in the crystal decreases, and the oxygen concentration increases when it is lowered to a deeper position in the melt. The upper limit position of the magnet apparatus is determined by the stroke of the elevating device and the interference with the pulling furnace side. In general, the chamber of the pulling furnace is connected with a hydraulic cylinder on the outside of the magnet device via an arm so that it can be moved up and down and turned. FIG. 13 shows an example of an elevating device 122 for the pulling furnace and an elevating device 123 for the superconducting magnets. This thus determines the upper limit position of the magnet arrangement. As the total height of the magnet device increases, the position of the center of the magnetic field, which is in the middle of the coil in the height direction, cannot be raised, which is disadvantageous in obtaining crystals with a low oxygen concentration.

The present invention has been made in view of the above problems. An object of the present invention is to provide a single crystal pulling apparatus and a method for pulling a single crystal which enables to reduce the coil height by increasing the magnetic field generation efficiency, and to raise the magnetic field center to near the melt surface of the semiconductor raw material, to obtain a single crystal with a lower oxygen concentration than before, and which enables to make the growth interface convex upward by making it possible to excite with a higher magnetic flux density than before, and making it possible to pull a defect-free crystal at a higher speed.

Solution to Problem

In order to achieve the above object, the present invention provides a single crystal pulling apparatus comprising: a pulling furnace in which a heating heater and a crucible containing a molten semiconductor raw material are arranged and has a central axis; and a magnetic field generating apparatus provided around the pulling furnace and having superconducting coils, for applying a horizontal magnetic field to the molten semiconductor raw material by energizing the superconducting coils to suppress convection of the molten semiconductor raw material in the crucible, > wherein the superconducting coils of the magnetic field generating apparatus are saddle-shaped and are curved along an outer shape of the pulling furnace, and two pairs of the saddle-shaped superconducting coils are arranged around the pulling furnace with the saddle-shaped superconducting coils of each pair arranged facing each other,
>
> when an axis passing through the centers of a pair of superconducting coils arranged facing each other is defined as a coil axis,
>
> two coil axes of the two pairs of superconducting coils are included in the same horizontal plane, and when a magnetic force line direction on the central axis of the pulling furnace in the horizontal plane is defined as a X-axis, and a direction perpendicular to the X-axis in the horizontal plane is defined as a Y-axis, a center angle α between the two coil axes sandwiching the X-axis is 90 degrees or less and an inter-coil angle β between adjacent superconducting coils sandwiching the Y-axis is 20 degrees or less.

By setting the center angle α sandwiching the X-axis between the two coil axes to be 90 degrees or less, and the inter-coil angle β sandwiching the Y axis between the adjacent superconducting coils to 20 degrees or less, convection suppressing force in the vicinity of the cross section perpendicular to the X-axis is generated and the magnetic flux density perpendicular to the crucible can be prevented from being too high in the angular region in the circumferential direction corresponding to the center position of the coil. The diffusion boundary layer near the crucible wall at the portion does not become thin, and the melting from the crucible (quartz crucible) is further suppressed. That is, by suppressing convection, the time required for oxygen eluted from the crucible wall to reach the single crystal can be increased, and the amount of oxygen evaporated from the free surface of the molten semiconductor raw material can be increased. Since elution of oxygen can be suppressed by suppressing molten from the crucible, the concentration of oxygen taken into the single crystal can be significantly reduced, making it possible to pull single crystals with extremely low oxygen concentrations.

In addition, since the center angle α and the inter-coil angle β are within the above ranges, for example, the total length of the coils can be extended more than the superconducting coils of Patent Document 2, so the magnetic flux density of the central axis can be increased compared to Patent Document 2. As the magnetic flux density near the growth interface increases, the temperature boundary layer directly under the rotating single crystal becomes thin, so that heat flows from the melt to the single crystal, and as a result, the growth interface becomes upward convex. In this state, if the single crystal is cooled from the side surface, it can be pulled with a uniform large temperature gradient in the plane, so that the defect-free region crystal can be pulled at a higher speed.

If the inter-coil angle β is greater than 20 degrees, the magnetic force line component perpendicular to the crucible near the cross section perpendicular to the magnetic force line (X-axis) becomes small, so the convection suppressing force cannot be obtained in this region. Further, when the center angle α is larger than 90 degrees, the total length of the superconducting coils is shortened due to the positional relationship with the adjacent coils (another pair of coils), the magnetic field generation efficiency is reduced and an effect to increase magnetic flux density at central axis can no longer be obtained.

Furthermore, since the center angle α and the inter-coil angle β are within the above ranges, the flow velocity in the cross section parallel to the X-axis of the molten semiconductor raw material and the flow velocity in the cross section perpendicular to the X-axis of the molten semiconductor raw material can be balanced. As a result, a single crystal pulling apparatus capable of suppressing growth striations in a single crystal to be grown can be obtained.

In addition, since the superconducting coils are saddle-shaped coils instead of a conventional circular coils, the circumference length of the coils can be increased, so even with the same current value, a magnetic field with a higher magnetic flux density can be generated. That is, the efficiency of magnetic field generation can be enhanced.

Furthermore, since the saddle shape makes the total height of the coil smaller than that of the circular one, the center height position of the coils in the magnetic field generating apparatus can be raised. Therefore, when the elevating device is lifted to the upper limit, the magnetic field center can be set at a higher position with respect to the melt, and it becomes possible to obtain a single crystal with oxygen concentration even lower than that of a conventional single crystal pulling apparatus such as that disclosed in Patent Document 2 for example.

At this time, the magnetic field generating apparatus may comprise an elevating device capable of moving up and down in a vertical direction.

As a result, an operator can easily disassemble and clean the hot zone in the furnace by lowering the magnetic field generating apparatus at the time of disassembling and setting after the end of the operation. Also in pulling a single crystal, it is possible to more easily adjust the height position of the magnetic field generating apparatus so that the oxygen concentration in the single crystal becomes a desired value.

Further, the saddle-shaped superconducting coils may have a vertical width shorter than a horizontal width.

With such a structure, the total height of the coils can be reduced more reliably, the center height position of the coils can be raised, the magnetic field center can be set at a higher position, and the low oxygen concentration single crystals can be more easily obtained.

The present invention also provides a method for pulling a single crystal, comprising pulling a semiconductor single crystal using the single crystal pulling apparatus.

With such a method for pulling a single crystal, it is possible to grow a semiconductor single crystal in which the concentration of oxygen taken is greatly reduced and growth striations are suppressed. Also, it is possible to pull a single crystal in the desired defect region. In particular, defect-free region crystals can be pulled at a higher speed.

At this time, when the semiconductor single crystal is pulled, a height position of the magnetic field generating apparatus may be adjusted according to a target value of oxygen concentration contained in the semiconductor single crystal.

By doing so, it is possible to finely control the oxygen concentration, and more reliably grow a semiconductor single crystal with a low oxygen concentration.

Further, when the semiconductor single crystal is pulled, a magnetic field strength may be adjusted according to a target defect region of the semiconductor single crystal.

In this way, for example, by increasing the magnetic field strength (or magnetic flux density) of the central axis as described above, the growth interface is made convex upward, and by cooling from the crystal side surface, a uniform temperature gradient within the plane can be obtained, and the defect-free region crystal can be pulled at a higher speed. Conversely, by lowering the magnetic field intensity (or magnetic flux density) of the central axis, the temperature gradient especially in the central portion of the crystal can be reduced, and a vacancy-rich single crystal can be pulled. In this way, a single crystal can be grown according to the target defect region.

Advantageous Effects of Invention

As described above, with the single crystal pulling apparatus of the present invention, it can be a single crystal pulling apparatus by which oxygen concentration taken into the single crystal can be greatly reduced, and growth striations in the single crystal to be grown can be suppressed. In addition, it can be a single crystal pulling apparatus capable of pulling a single crystal in a desired defect region (especially a defect-free region crystal) at a higher speed than before.

Further, according to the method for pulling single crystal of the present invention, it is possible to grow a semiconductor single crystal in which the concentration of oxygen taken is greatly reduced and growth striations are suppressed. Further, it is possible to adjust the defect region to a desired one by adjusting the magnetic field strength (magnetic flux density) of the central axis.

BRIEF DESCRIPTION OF DRAWINGS

FIG. 1 is a schematic diagram showing an example of a single crystal pulling apparatus of the present invention;

FIG. 2A is a perspective view showing an example of the shape of the superconducting coils of the present invention;

FIG. 2B is a cross-sectional view showing an example of the arrangement of the superconducting coils of the present invention;

FIG. 3 is an analysis diagram showing a magnetic flux density distribution in Example 1;

FIG. 4 is an analysis diagram showing velocity vectors and oxygen concentration distributions in the melt in Example 1;

FIG. 5 is an analysis diagram showing velocity vectors and oxygen concentration distributions in the melt in Example 2;

FIG. 6 is an analysis diagram showing magnetic flux density distribution in Comparative Example 1;

FIG. 7 is an analysis diagram showing velocity vectors and oxygen concentration distributions in the melt in Comparative Example 1;

FIG. 8 is a schematic diagram showing an example of a conventional single crystal pulling apparatus;

FIG. 9 is a schematic diagram showing an example of a conventional superconducting magnet;

FIG. 10 is an explanatory diagram showing an example of the magnetic field distribution of a conventional superconducting magnet;

FIG. 11A is a perspective view showing an example of another conventional superconducting magnet;

FIG. 11B is a cross-sectional view showing an example of another conventional superconducting magnet;

FIG. 12A is a schematic diagram showing an example of another conventional single crystal pulling apparatus;

FIG. 12B is a cross-sectional view showing an example of another conventional superconducting magnet;

FIG. 13 is a schematic diagram showing an example of a elevating device for a pulling furnace and a elevating device for a superconducting magnet;

FIG. 14 is a graph showing the relationship between the magnetic flux density component (B⊥) orthogonal to the inner wall of the crucible and the circumferential angle;

FIG. 15 is an analysis diagram showing the magnetic flux density distribution in Comparative Example 2;

FIG. 16 is an analysis diagram showing velocity vectors and oxygen concentration distributions in the melt in Comparative Example 2; and FIG. 17 is an analysis diagram showing velocity vectors and oxygen concentration distributions in the melt in Comparative Example 3.

DESCRIPTION OF EMBODIMENTS

When a conductive fluid moves in a magnetic field, an induced current is generated in the direction perpendicular to the magnetic force line and the velocity component perpendicular to the magnetic force line. When a quartz crucible that has electrical insulation property is used, since the crucible wall and the free surface of the molten semiconductor raw material serve as an insulating wall, the induced current in the direction orthogonal to them does not flow. For this reason, the convection suppressing force becomes insufficient in the vicinity of the section perpendicular to the X-axis among the molten semiconductor raw materials.

However, when two pairs of superconducting coils with the coils of each pair arranged facing each other are provided around the pulling furnace and an axis passing through the centers of a pair of superconducting coils arranged facing each other is defined as a coil axis, the two coil axes of the two pairs of superconducting coils are included in the same horizontal plane, the center angle α sandwiching the X-axis (the direction of the magnetic force line in the central axis of the pulling furnace in the horizontal plane) between the two coil axes is 90 degrees or less, and the inter-coil angle β sandwiching the Y-axis (the direction perpendicular to the X-axis in the horizontal plane) between the adjacent superconducting coils is 20 degrees or less, even in a cross section perpendicular to the X-axis where the electromagnetic force is insufficient to suppress convection, the flow velocity of the molten semiconductor raw material can be reduced, and it is possible to balance the flow velocity in the cross section parallel to the X-axis of the molten semiconductor raw material and the flow velocity in the cross section perpendicular to the X-axis of the molten semiconductor raw material. As a result, as described above, the concentration of oxygen taken into the single crystal can be greatly reduced, and growth striations in the grown single crystal can be suppressed. In addition, for example, the total length of the coils can be extended more than the superconducting coils of Patent Document 2, and the magnetic flux density of the central axis can be further increased. As a result, especially, the growth interface can become upward convex and a defect-free region crystal can be pulled at a higher speed.

Furthermore, if saddle-shaped coils are used as the superconducting coils, the efficiency of magnetic field generation can be improved, and the total height of the coils can be made smaller than that of a circular coils. The center height position of the coils can be raised, the position of the magnetic field center can be set higher, and a single crystal with a much lower oxygen concentration can be obtained.

The inventors of present invention found these things and completed the present invention.

Hereinafter, embodiments of the present invention will be described with reference to the drawings, but the present invention is not limited thereto.

FIG. 1 shows an example of the single crystal pulling apparatus of the present invention.

The single crystal pulling apparatus 11 in FIG. 1 is based on the CZ method, and is provided with a pulling furnace 1 having a central axis 10, in which a heating heater 3 and a quartz crucible 2 containing molten semiconductor raw material (hereinafter also referred to as melt) 6 are arranged, and a superconducting magnet (magnetic field generating apparatus 30) provided around the pulling furnace 1 and having superconducting coils. The apparatus 11 is configured so that the single crystal 9 is pulled in the pulling direction 8 while the convection of the melt 6 in the crucible 2 is suppressed by applying the voltage to the superconducting coils to apply a horizontal magnetic field.

Here, the shape and arrangement of the superconducting coils in the magnetic field generating apparatus 30 will be described in detail with reference to FIGS. 2A and 2B. FIG. 2A is a perspective view showing an example of the shape of superconducting coils, and FIG. 2B is a cross-sectional view showing an example of their arrangement.

There are a total of four superconducting coils (also referred to simply as coils) 4 (4a-4d), each of which has a saddle shape curved along the outer shape of the cylindrical pulling furnace 1. Around the pulling furnace 1, there are provided two sets of a pair of coils with the coils arranged facing each other. Here, the combinations are 4a and 4c, and 4b and 4d.

Since the coils 4 have saddle shape instead of conventional circular shape, the circumference length of the coils can be increased, a magnetic field with a higher magnetic flux density can be generated, and the efficiency of magnetic field generation can be made high.

Moreover, since the overall height of the coils can be made smaller than in circular coils, the center height position of the coils can be raised to a higher position than in circular coils. That is, the magnetic field center can be set at a position higher to the melt 6, and a single crystal 9 with a lower oxygen concentration can be produced.

It should be noted that the coils 4 may have a vertical width that is shorter than its horizontal width. In this case, the total height of the coils can be reduced more reliably, and the low oxygen concentration single crystal 9 can be obtained more easily.

In addition, when an axis passing through the centers of the pair of coils 4 arranged facing each other is defined as a coil axis, two coil axes 13 and 14 of the two pairs of coils 4 (pair of 4a and 4c and pair of 4b and 4d) are included in the same horizontal plane 12 (see FIG. 1). Regarding magnetic force lines 7, when a magnetic force line direction on the central axis 10 of the pulling furnace 1 in the horizontal plane 12 is defined as a X-axis, among angles formed by the two coil axes 13 and 14, an angle sandwiching the X-axis (center angle c) is 90 degrees or less.

In addition, between adjacent coils, an angle (inter-coil angle β) sandwiching the Y-axis (the direction perpendicular to the X-axis in the horizontal plane 12) is 20 degrees or less. It is between different pairs of coils, in case of 2A and 2B, the angle between the coil 4d side end of the coil 4a and the coil 4a side end of the coil 4d, and the angle between the coil 4b side end of the coil 4c and the coil 4c side end of the coil 4b are the inter-coil angle β.

The possible range of the inter-coil angle β is 0 to 20 degrees. When the inter-coil angle β is the minimum value of 0 degrees, the possible value of the center angle α is 90 degrees, the maximum value. On the other hand, when the inter-coil angle β is the maximum value of 20 degrees, the possible range of the center angle α is 80 to 90 degrees.

Regarding the saddle-shaped coils 4, the effect when the center angle α and the inter-coil angle β are within the above ranges will be described below.

First, as described above, the convection suppressing force is insufficient in the vicinity of the cross section perpendicular to the X-axis in the molten semiconductor raw material. As the center angle α is 90 degrees or less and inter-coil angle β is 20 degrees or less, it is possible to generate a convection suppressing force in the vicinity of the cross section perpendicular to the X-axis. In addition, since the magnetic flux density perpendicular to the crucible can be prevented from being too high in the circumferential angular region corresponding to the center position of the coils in planar view, thinning of the diffusion boundary layer near the crucible wall at the portion can be eliminated, and melting from the quartz crucible is further suppressed. These make it possible to obtain a single crystal with a significantly reduced oxygen concentration.

Here, the suppression of melting from the quartz crucible will be described more specifically with an example.

FIG. 14 is a plot of the magnetic flux density component B⊥ perpendicular to the crucible wall of a 32 inches (800 mm) crucible versus the circumferential angle when the X-axis is 90 degrees. Here, the circumferential angle is a counterclockwise angle θ with respect to the Y-axis (0 degree) between the coils 4a and 4d as shown in FIG. 2B. Four types of patterns (two circular coils patterns and two saddle-shaped coils patterns) are plotted. The pattern of the circular coils in FIG. 14 is the coils described in Patent Document 2. In the horizontal plane including the coil axis, when the direction of the magnetic force line on the central axis of the pulling apparatus is defined as the X-axis, two pairs of coils, in which the coils of each pair are arranged facing each other and having a width of 900 mm, are prepared, and the coil axes of the two pairs of coils are provided in the same horizontal plane, and the center angles α sandwiching the X-axis are set to 120 degrees and 60 degrees in a cylindrical container. In the circular coil with α=60 degrees, B⊥ is small near 0 degrees, which corresponds to the cross section perpendicular to the magnetic force line (X-axis), whereas in the circular coil with α=120 degrees, it is very strong around 0 degrees and it is weak near 90 degrees instead. Therefore, it can be seen that a strong convection suppressing force can be obtained even in the vicinity of the cross section perpendicular to the magnetic force lines (X-axis).

On the other hand, even with saddle-shaped coils, if α=120 degrees and β=6 degrees, B⊥ near 0 degrees is large and B⊥ near 90 degrees decreases, it can be seen that the distribution is similar.

On the other hand, in the saddle-shaped coils with α=90 degrees and β=20 degrees, which is an example of the present invention, the peak seen at around 35 degrees in the saddle-shaped coils with α=120 degrees shifts to around 45 degrees, and the maximum value is also getting smaller. However, compared to the circular coil with α=60 degrees, B⊥ near 0 degrees is still strong, and B⊥ increases near 90 degrees corresponding to the X-axis. Therefore, it can be seen that the convection suppressing force acts equally not only in the vicinity of the cross section perpendicular to magnetic force line (X-axis), but also in the entire circumferential direction. Since extremely large B⊥ disappears, the diffusion boundary layer near the crucible wall does not become thin at that portion, and the melting from the quartz crucible is further suppressed.

In addition, it is possible to balance the flow velocity in the cross section parallel to the X-axis and the flow velocity in the cross section perpendicular to the X-axis of the melt 6. The striation in the single crystal 9 can be suppressed by realization of the balance.

In addition, for example, the total length of the coils 4 can be extended more than the coils of Patent Document 2, and in particular, the magnetic flux density at the central axis 10 can be further increased, and the growth interface of the single crystal 9 to be grown can be made convex upward. This enables high-speed pulling of defect-free region crystals.

Here, for example, Patent Document 4 discloses an electromagnet in which a plurality of saddle-shaped coils are arranged around a crucible. The magnetic field generated by the electromagnet is a rotating magnetic field that is synchronized with the rotation of the crucible in the direction perpendicular to the axis to pull the single crystal. Therefore, it is completely different from the static magnetic field as in the present invention. In Patent Document 4 says that, by controlling the excitation and demagnetization times of a plurality of coils, a rotating magnetic field is generated in synchronization with the rotation of the crucible, thereby applying a driving force in the circumferential direction to the melt and making the relative velocity between the crucible and the melt to be zero, and crystals containing no impurities can be obtained by reducing dissolution from the crucible. However, even if the single crystal pulling apparatus 11 of the present invention is not a magnetic field generating apparatus that requires complicated control as in Patent Document 4, the melting from the crucible is reduced as described above to produce crystals with extremely low oxygen concentration. In addition, it is possible to pull a desired defect region single crystal, for example, a defect-free region crystal containing about 10 ppma-JEIDA oxygen at a higher speed.

Further, the single crystal pulling apparatus 11 has an elevating device 22 for the pulling furnace 1, which enables the pulling furnace 1 to move up and down in the vertical direction and to turn.

Further, there is provided an elevating device 23 for the magnetic field generating apparatus 30, and the magnetic field generating apparatus 30 installed on the elevating device 23 can be vertically moved up and down (up and down movement). As a result, hot zone in the pulling furnace 1 can be easily disassembled and cleaned after the operation is finished, and the oxygen concentration of the single crystal 9 to be grown can be easily adjusted by adjusting the height of the magnetic field generating apparatus 30.

Next, the method for pulling a single crystal of the present invention using the single crystal pulling apparatus 11 of the present invention as described above will be described.

Here, a method for pulling a silicon single crystal, which is a semiconductor single crystal, will be described.

First, in the single crystal pulling apparatus 11, a semiconductor raw material (polycrystalline silicon) is placed in the crucible 2 and heated by the heating heater 3 to melt the semiconductor raw material (melt 6).

Next, by energizing the superconducting coils 4, a horizontal magnetic field generated by the magnetic field generating apparatus 30 is applied to the melt 6 to suppress convection of the melt 6 within the crucible 2.

Next, a seed crystal (not shown) is lowered to contact with the melt 6, for example, from above the central portion of the crucible 2 and the seed crystal is pulled upward in a pulling direction 8 at a predetermined rate by a pulling mechanism (not shown) while rotating it. As a result, a crystal grows in the solid/liquid interface layer, and a semiconductor single crystal (silicon single crystal) 9 is produced.

With such a single crystal pulling method, it is possible to grow a semiconductor single crystal in which the concentration of oxygen taken is greatly reduced and growth striations are suppressed. The oxygen concentration in the single crystal to be pulled is not particularly limited, but in particular, it is possible to produce a single crystal with 5 ppma-JEIDA or less, preferably 3 ppma-JEIDA or less, and further 1 ppma-JEIDA or less.

When pulling this semiconductor single crystal, the height position of the magnetic field generating apparatus 30 can be adjusted using the elevating device 23 according to the target value of the oxygen concentration contained in the semiconductor single crystal.

Specifically, the relationship between the height position of the magnetic field generating apparatus 30 and the oxygen concentration in the single crystal 9 is obtained in advance by experiments or the like, and the height position of the magnetic field generating apparatus 30 is adjusted to set to the desired height position before starting the pulling. While pulling the single crystal 9, the oxygen concentration in the single crystal can be controlled by other parameters without changing the magnetic field height. Typical parameters can be crucible rotation, heater position, and the like.

Further, fine oxygen concentration control is possible by pattern-controlling the height position of the magnetic field generating apparatus 30 during the pulling of one single crystal 9.

Further, by adjusting the magnetic field strength (magnetic flux density), the defect region of the single crystal to be grown can be adjusted to the target defect region. As described above, since the total length of the coils can be extended more than the coils of Patent Document 2, for example, the magnetic flux density in the central axis can be increased, and as a result, the defect-free region crystal can be pulled at a higher speed. Conversely, if the central magnetic flux density is lowered, the temperature gradient especially in the central portion will become smaller, so a vacancy-rich single crystal can be obtained.

EXAMPLE

The present invention will be described in more detail below with reference to Examples and Comparative Examples of the present invention, but the present invention is not limited to these.

Example 1

A single crystal was pulled using the single crystal pulling apparatus 11 of the present invention shown in FIGS. 1, 2A, and 2B.

Magnetic field analysis and 3D melt convection analysis were performed regarding a magnetic field generating apparatus. In the apparatus, four saddle-shaped superconducting coils with a vertical width of 620 mm and a horizontal width (length of the outermost circumference along the curve) of 1262 mm (1381 mm) along a circle with a radius of 900 mm centered on the central axis of the pulling furnace were arranged in a horizontal plane (two pairs of coils with the coils of each other facing each other), and when the direction of the magnetic force line on the central axis was defined as the X-axis, the center angle α between the two coil axes sandwiching the X-axis was 90 degrees, and an inter-coil angle β sandwiching the Y-axis perpendicular to the X-axis was 20 degrees. Then a silicon single crystal was pulled using the apparatus.

The calculation conditions for the analysis were a charge amount of 400 kg, a 32-inch (800 mm) crucible, a silicon single crystal with a diameter of 306 mm, a crystal rotation of 9 rpm, a crucible rotation of 0.4 rpm, and a pulling speed of 0.4 mm/min.

FIG. 3 shows the results of magnetic field analysis by ANSYS-Maxwell 3D, and the magnetic flux density distribution is displayed after the analysis has been performed by adjusting the coil current and the number of turns so that the magnetic flux density at the central axis is 1000 Gauss.

From the results of the above magnetic field analysis, the magnetic flux density of the space containing the crystal and the melt region was extracted, and 3D melt convection analysis considering the magnetic field distribution was performed using CGSim 3D Flow. The center height position of the coils (also referred to as the height position of the coil axis) was set to the surface of the melt as in Comparative Example 3 described later. The left side of FIG. 4 shows the resulting velocity vectors in the melt, and the right side shows the oxygen concentration distributions in the melt. ⊥B shows the cross section perpendicular to the magnetic force lines, and //B shows the cross section parallel to the magnetic force lines.

Even in the magnetic field of Example 1, as in Comparative Example 3, which will be described later, the convection suppression force is strong even in the cross section perpendicular to the magnetic force lines, and a relatively active flow can be seen only under the edge of the crystal, and the oxygen concentration in the melt is low.

Even with such a coil shape and arrangement according to the present invention, it was possible to obtain a crystal with an extremely low oxygen concentration less than 1 ppma-JEIDA over the entire wafer surface and has an excellent in-plane distribution.

Example 2

The saddle-shaped coils of Example 1 had a longer coil length and a higher magnetic field generation efficiency, making it possible to excite up to 4000 Gauss on the central axis. For this reason, in Example 2, the magnetic flux density in the central axis was set to 4000 Gauss, the height position of the coil axis was set to the melt surface, 3D melt convection analysis was performed, and a single crystal was pulled using the apparatus.

FIG. 5 shows velocity vectors in the melt and the oxygen concentration distributions in the melt obtained by numerical analysis. It can be seen that although the oxygen concentration in the melt is higher than in Example 1 (3-5 ppma-JEIDA near the growth interface), the growth interface has a large upward convex shape. With such a shape of the growth interface, since the temperature gradient G in the vertical direction within the plane is approximately the same, it is possible to pull the defect-free region crystal.

Comparative Example 1

A single crystal was pulled using a single crystal pulling apparatus with a conventional superconducting magnet (magnetic field generating apparatus) shown in FIGS. 12A and 12B.

Magnetic field analysis and 3D melt convection analysis were performed regarding a magnetic field generating apparatus. In the apparatus, in the horizontal plane including the coil axis, when the direction of the magnetic force line in the central axis of the pulling apparatus was defined as the X-axis, two pairs of circular coils with the coils of each pair arranged facing each other with a diameter of 900 mm were arranged so that the respective coil axes were included in the same horizontal plane, a center angle between the coil axes sandwiching the X axis was 120 degrees, and the apparatus was placed in a cylindrical vacuum container. Then, pulling of a silicon single crystal was performed.

The calculation conditions for the analysis were a charge amount of 400 kg, a 32-inch (800 mm) crucible, a silicon single crystal with a diameter of 306 mm, a crystal rotation of 9 rpm, a crucible rotation of 0.4 rpm, and a pulling speed of 0.4 mm/min.

FIG. 6 shows the results of magnetic field analysis by ANSYS-Maxwell 3D, and the magnetic flux density distribution is displayed after the analysis is performed by adjusting the coil current and the number of turns so that the magnetic flux density at the central axis is 1000 Gauss.

From the results of the magnetic field analysis described above, the magnetic flux density of the space containing the crystal and the melt region was extracted, and a 3D melt convection analysis was performed in consideration of the magnetic field distribution. The height position of the coil axis was set at a position 140 mm below the melt surface, which is the upper limit position in Comparative Example 1. FIG. 7 shows the velocity vectors in the melt obtained from the results, and the oxygen concentration distributions in the melt on the right.

In the magnetic field of Comparative Example 1, the convection suppression force is strong even in the cross section perpendicular to the magnetic force lines, and a relatively active flow can be seen only under the edge of the crystal, and the oxygen concentration in the melt is low.

With this coil arrangement, it is possible to obtain a crystal with an extremely low oxygen concentration of about 3 to 5 ppma-JEIDA on the entire wafer surface and an excellent in-plane distribution, but it is necessary to increase the coil diameter in order to increase the magnetic field generation efficiency. If trying to raise the center height of the coil to further lower the oxygen concentration, it is likely to interfere with the pulling apparatus. Therefore, in the apparatus of Comparative Example 1, it is difficult to further lower the oxygen concentration.

Comparative Example 2

Magnetic field analysis and 3D melt convection analysis were performed regarding a magnetic field generating apparatus. In the apparatus, four saddle-shaped superconducting coils with a vertical width of 620 mm and a horizontal width (length of the outermost circumference along the curve) of 855 mm (887 mm) along a circle with a radius of 900 mm centered on the central axis of the pulling furnace were arranged in a horizontal plane (two pairs of coils with the coils of each pair facing each other), and when the direction of the magnetic force line on the central axis was defined as the X-axis, the center angle α between the two coil axes sandwiching the X-axis was 120 degrees, and an inter-coil angle β sandwiching the Y-axis perpendicular to the X-axis was 6 degrees. Then silicon single crystal was pulled using the apparatus.

FIG. 15 shows the results of magnetic field analysis by ANSYS-Maxwell 3D, and the magnetic flux density distribution is displayed after the analysis has been performed by adjusting the coil current and the number of turns so that the magnetic flux density at the central axis is 1000 Gauss.

From the results of the magnetic field analysis described above, the magnetic flux density of the space containing the crystal and the melt region was extracted, and a 3D melt convection analysis was performed in consideration of the magnetic field distribution. The center height position of the coil was set 140 mm below the melt surface as in Comparative Example 1. The left side of FIG. 16 shows the velocity vectors in the melt obtained from the results, and the right side shows the oxygen concentration distributions in the melt.

Even in the magnetic field of Comparative Example 2, as in Comparative Example 1, the convection suppression force is strong even in the cross section perpendicular to the magnetic force lines, and relatively active flow can be seen only under the edge of the crystal, and the oxygen concentration in the melt is low.

Even with such a coil shape and arrangement, it is possible to obtain a crystal with an extremely low oxygen concentration of about 3 to 5 ppma-JEIDA on the entire wafer surface and excellent in-plane distribution.

In addition, since the vertical width of the coil is smaller than that of Comparative Example 1, there is room for raising the center height position of the coils in order to further reduce the oxygen concentration. This will be described later as Comparative Example 3.

Comparative Example 3

By using the saddle-shaped coils of Comparative Example 2, the coil height (coil vertical width) could be reduced by 280 mm compared to Comparative Example 1 (total coil height: 900 mm). Therefore, in Comparative Example 3, after 3D melt convection analysis was performed by setting the height position of the coil axis to the melt surface, the silicon single crystal was pulled using this apparatus.

FIG. 17 shows the velocity vectors in the melt and the oxygen concentration distributions in the melt obtained by numerical analysis. It can be seen that the oxygen concentration in the melt is lower than in Comparative Example 2.

In fact, with this coil arrangement, the center height position of the coil can be set at the melt surface, and an extremely low oxygen concentration crystal less than 1 ppma-JEIDA in the entire wafer surface with excellent in-plane distribution could be obtained.

However, as shown in Comparative Examples 2 and 3, in the coil arrangement in which the center angle α is greater than 90 degrees, it is difficult to increase the magnetic flux density at the center, since the coil length is shortened, the arrangement is such that magnetic field lines repel each other, and therefore magnetic field generation efficiency is low. The upper limit of the magnetic flux density is determined by ensuring that the force applied to the coils is within a range that can be supported by the structural material, and by designing with a margin so that the empirical magnetic field inside the coils does not reach the saturation magnetic flux density of the superconducting wire. The upper limit of these coils was about 2000 Gauss at the center. At this level of magnetic flux density, the temperature boundary layer directly under the rotating crystal is not sufficiently thin, so it is difficult to make the crystal growth interface convex upward, and therefore, there is a disadvantage that making it difficult to obtain defect-free region crystals that is necessary to make temperature gradient in whole growth interface to be even. In other words, it is not a like the pulling apparatus of the present invention which is suitable not only for pulling low oxygen concentration single crystals but also for pulling defect-free region crystals.

Comparative Example 4

Magnetic field analysis and 3D melt convection analysis were performed regarding a magnetic field generating apparatus. In the apparatus, four saddle-shaped superconducting coils with a vertical width of 620 mm and a horizontal width (length of the outermost circumference along the curve) of 942 mm (986 mm) along a circle with a radius of 900 mm centered on the central axis of the pulling furnace were arranged in a horizontal plane (two pairs of coils with the coils of each pair facing each other), and the center angle $\alpha$ was 90 degrees, and an inter-coil angle $\beta$ was 30 degrees. Then silicon single crystal was pulled using the apparatus.

As in Comparative Example 3, the center height position of the coil could be set to the melt surface, but the oxygen concentration was about 2-3 ppma-JEIDA over the entire wafer surface, which was higher than in Comparative Example 3. It is considered that the inter-coil angle $\beta$ becomes larger than 20 degrees, and the magnetic force component orthogonal to the crucible near the cross section perpendicular to the X-axis becomes small, and the suppression of convection there becomes weak, so the oxygen concentration increases.

Further, in a coil arrangement in which the inter-coil angle $\beta$ is greater than 20 degrees, the coil length becomes short and the magnetic force lines repel each other, so the magnetic field generation efficiency becomes low. Therefore, it becomes difficult to raise magnetic flux density at the center. The upper limit of the magnetic flux density is determined by ensuring that the force applied to the coils is within a range that can be supported by the structural material, and by designing with a margin so that the empirical magnetic field inside the coils does not reach the saturation magnetic flux density of the superconducting wire. The upper limit of these coils was about 3000 Gauss at the center because the empirical magnetic field inside the coil tends to be high. At this level of magnetic flux density, the temperature boundary layer just below the rotating crystal is not yet sufficiently thin, so the growth interface has a small upward convexity, and therefore, there is a disadvantage that making it difficult to pull defect-free region crystals that is necessary to make temperature gradient in whole growth interface to be even at high speed. In other words, it is not a like the pulling apparatus of the present invention which is suitable not only for pulling low oxygen concentration single crystals but also for pulling defect-free region crystals.

Example 3

Magnetic field analysis and 3D melt convection analysis were performed in the same manner as in Example 1 except that four superconducting coils with a vertical width of 620 mm and a horizontal width (the length of the outermost circumference along the curve) of 1185 mm (1282 mm) were arranged in the same horizontal plane (two pairs of coils with the coils of each pair facing each other), and the center angle $\alpha$ was 86 degrees and the inter-coil angle $\beta$ was 16 degrees. Then a silicon single crystal was pulled using this apparatus.

With these coil shape and arrangement of the present invention, an extremely low oxygen concentration crystal less than 1 ppma-JEIDA in the entire wafer surface with excellent in-plane distribution could be obtained.

The present invention is not limited to the above embodiments. The above-described embodiments are just examples, and any examples that substantially have the same configuration and demonstrate the same functions and effects as those in the technical concept disclosed in the claims of the present invention are included in the technical scope of the present invention.

The invention claimed is:

1. A single crystal pulling apparatus comprising: a pulling furnace in which a heating heater and a crucible containing a molten semiconductor raw material are arranged and has a central axis; and a magnetic field generating apparatus provided around the pulling furnace and having superconducting coils, for applying a horizontal magnetic field to the molten semiconductor raw material by energizing the superconducting coils to suppress convection of the molten semiconductor raw material in the crucible, wherein the superconducting coils of the magnetic field generating apparatus are saddle-shaped and are curved along an outer shape of the pulling furnace, the saddle-shaped superconducting coils having a vertical width shorter than a horizontal width, and two pairs of the saddle-shaped superconducting coils are arranged around the pulling furnace with the saddle-shaped superconducting coils of each pair arranged facing each other, when an axis passing through the centers of a pair of superconducting coils arranged facing each other is defined as a coil axis, two coil axes of the two pairs of superconducting coils are included in the same horizontal plane, and when a magnetic force line direction on the central axis of the pulling furnace in the horizontal plane is defined as a X-axis, and a direction perpendicular to the X-axis in the horizontal plane is defined as a Y-axis, a center angle $\alpha$ between the two coil axes sandwiching the X-axis is 90 degrees or less and an inter-coil angle $\beta$ between adjacent superconducting coils sandwiching the Y-axis is 20 degrees or less.

2. The single crystal pulling apparatus according to claim 1, wherein the magnetic field generating apparatus comprises an elevating device capable of moving up and down in a vertical direction.

3. The single crystal pulling apparatus according to claim 2, wherein the saddle-shaped superconducting coils have a vertical width shorter than a horizontal width.

4. A method for pulling a single crystal, comprising pulling a semiconductor single crystal using the single crystal pulling apparatus according to claim 1.

5. A method for pulling a single crystal, comprising pulling a semiconductor single crystal using the single crystal pulling apparatus according to claim 2.

6. A method for pulling a single crystal, comprising pulling a semiconductor single crystal using the single crystal pulling apparatus according to claim 3.

7. The method for pulling a single crystal according to claim 4, wherein when the semiconductor single crystal is pulled, a height position of the magnetic field generating apparatus is adjusted according to a target value of oxygen concentration contained in the semiconductor single crystal.

8. The method for pulling a single crystal according to claim 5, wherein when the semiconductor single crystal is pulled, a height position of the magnetic field generating apparatus is adjusted according to a target value of oxygen concentration contained in the semiconductor single crystal.

9. The method for pulling a single crystal according to claim 6, wherein when the semiconductor single crystal is pulled, a height position of the magnetic field generating apparatus is adjusted according to a target value of oxygen concentration contained in the semiconductor single crystal.

10. The method of pulling a single crystal according to claim 4, wherein, when the semiconductor single crystal is pulled, a magnetic field strength is adjusted according to a target defect region of the semiconductor single crystal.

11. The method of pulling a single crystal according to claim 5, wherein, when the semiconductor single crystal is pulled, a magnetic field strength is adjusted according to a target defect region of the semiconductor single crystal.

12. The method of pulling a single crystal according to claim 6, wherein, when the semiconductor single crystal is pulled, a magnetic field strength is adjusted according to a target defect region of the semiconductor single crystal.

13. The method of pulling a single crystal according to claim 7, wherein, when the semiconductor single crystal is pulled, a magnetic field strength is adjusted according to a target defect region of the semiconductor single crystal.

14. The method of pulling a single crystal according to claim 8, wherein, when the semiconductor single crystal is pulled, a magnetic field strength is adjusted according to a target defect region of the semiconductor single crystal.

15. The method of pulling a single crystal according to claim 9, wherein, when the semiconductor single crystal is pulled, a magnetic field strength is adjusted according to a target defect region of the semiconductor single crystal.

* * * * *